United States Patent [19]

Hongu et al.

[11] 4,169,248
[45] Sep. 25, 1979

[54] OSCILLATING CIRCUIT

[75] Inventors: Masayuki Hongu, Komae; Hiromi Kawakami, Yokohama; Yoshihiro Yamamoto; Masaharu Tokuhara, both of Tokyo, all of Japan

[73] Assignee: Sony Corporation, Tokyo, Japan

[21] Appl. No.: 883,786

[22] Filed: Mar. 6, 1978

[30] Foreign Application Priority Data

Mar. 10, 1977 [JP] Japan ................................ 52/26341

[51] Int. Cl.² ........................ H03B 5/12; H03B 27/00
[52] U.S. Cl. ..................................... 331/45; 331/60; 331/75; 331/114; 331/117 R
[58] Field of Search ............... 331/114, 60, 45, 117 R, 331/75; 307/232; 328/127, 155; 330/303, 311

[56] References Cited
U.S. PATENT DOCUMENTS 3,766,494 10/1973 Anbe ...................................... 330/303
3,782,784 1/1974 Marouby ............................. 328/127
3,963,996 6/1976 Skerlos ................................ 331/117

*Primary Examiner*—Siegfried H. Grimm
*Attorney, Agent, or Firm*—Lewis H. Eslinger; Alvin Sinderbrand

[57] ABSTRACT

An oscillating circuit provides first and second reference signals having a phase difference of 90° with respect to each other. The oscillating circuit includes an oscillator providing the first reference signal at an output thereof, a voltage-to-current converting circuit, which may incorporate a common-base transistor, and a capacitor connected between the output of the oscillator and an input of the converting circuit. The output of the converting circuit then provides the second reference signal which differs in phase by 90° from the first reference signal. The oscillator may include differentially connected transistors and an LC resonant circuit.

10 Claims, 3 Drawing Figures

OSCILLATING CIRCUIT

BACKGROUND OF THE INVENTION

1. Field of the Invention

This invention relates generally to an oscillator for a synchronous detection using a phase-locked loop, and more particular to an oscillating circuit which can produce a first reference signal for a phase-locked loop and a second reference signal having a 90° phase difference with respect to the first reference signal effecting synchronous detection.

2. Description of the Prior Art

It is known in the art to use a phase-locked loop circuit for producing a reference carrier for synchronous detection. However, in a conventional phase-locked loop circuit, a phase of an output reference signal is different by 90° from that of an input signal. As a result an additional phase shifter is needed to make the phase of the reference coincide with the phase of input signal to be detected.

OBJECTS AND SUMMARY OF THE INVENTION

An object of the invention is to provide a reference signal generator circuit used for a synchronous detection.

Another object of the invention is to provide an oscillator circuit for producing two reference signals, each being separated in phase by 90° from each other.

Still another object of the invention is to provide an oscillator for producing two reference signals having a phase difference of 90° without requiring an additional phase shifter.

According to an example of the present invention, there is provided an oscillating circuit which comprises an oscillator having a first output terminal for providing a first reference signal, a converter circuit for converting a voltage to a current and which has an input terminal with a low input impedance and a second output terminal for providing a second reference signal, and a capacitor connected between the first output terminal and the input terminal of the converter circuit, so that the first and second reference signals are separated in phase by 90° with respect to each other.

The other objects, features and advantages of the present invention will become apparent from the following description taken in conjunction with the accompanying drawings.

DESCRIPTION OF THE PREFERRED EMBODIMENTS

The oscillator circuit according to the present invention will be hereinafter described with reference to the drawings.

Figure 1:
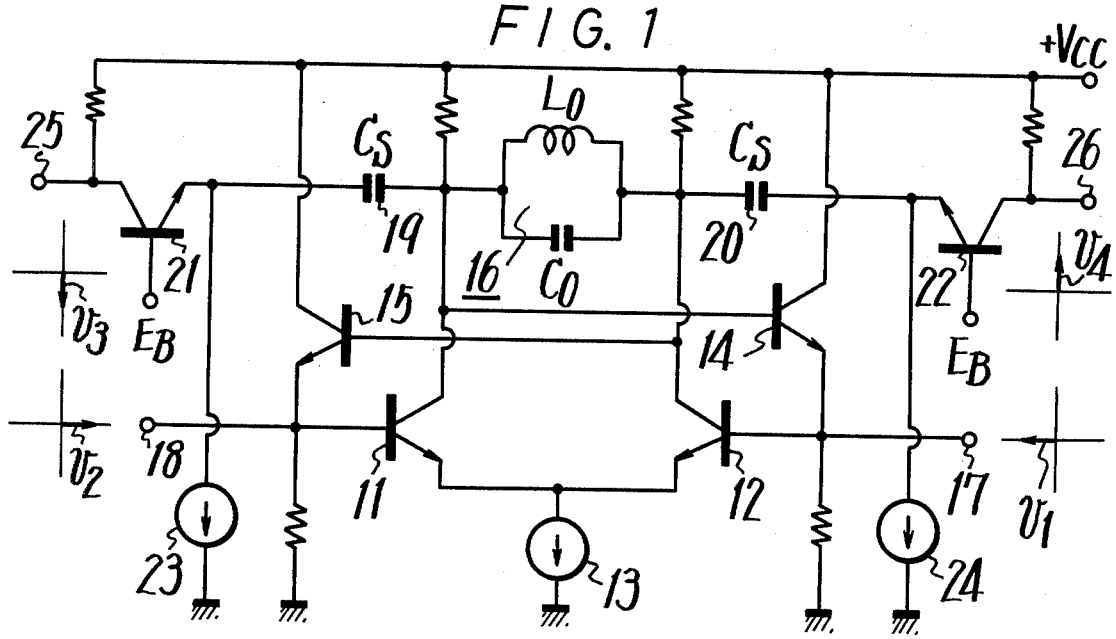
FIG. 1 is a circuit diagram showing an example of the oscillator circuit according to the present invention.

FIG. 1 is a circuit diagram showing an example of the oscillator circuit according to this invention in which oscillation outputs different in phase by 90° with each other can be developed using a push-pull technique. In this example, there are provided transistors 11 and 12 whose emitters are connected together to ground through a constant current source 13 to form a differential amplifier. The collectors of transistors 11 and 12 are connected through base-emitter paths of transistors 14 and 15 to the bases of opposite transistors 12 and 11, respectively. A parallel resonant circuit 16, which consists of a coil $L_O$ and a capacitor $C_O$, is connected between the collectors of transistors 11 and 12. The transistors 14 and 15 are each formed to be of an emitter follower configuration and output terminals 17 and 18 are provided from the emitters of transistors 14 and 15, respectively. Both ends of parallel resonant circuit 16, that is, the collectors of transistors 11 and 12, are connected through capacitors 19 and 20 to the emitters of transistors 21 and 22, respectively. The bases of these transistors 21 and 22 are supplied with a constant voltage $E_B$, respectively, their emitters are connected to ground through constant current sources 23 and 24, and their collectors are connected to output terminals 25 and 26, respectively, Thus, the transistors 21 and 22 serve as common-base amplifiers. In this example, the collectors of transistors 11, 12, 21 and 22 are connected through resistors to a power source terminal of voltage $+V_{cc}$.

Figure 2:
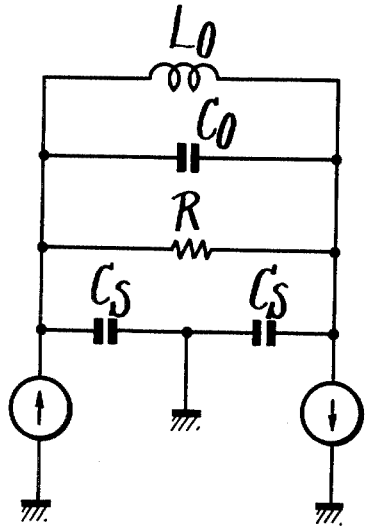
FIG. 2 is an equivalent circuit of the main part of the oscillator circuit shown in FIG. 1.

In the example of the invention shown in FIG. 1, capacitors 19 and 20, each are at one side connected to the collectors of transistors 11 and 12, and are connected at the other side to the emitters of common-base transistors 21 and 22 respectively. Thus for high frequencies, the former sides of capacitors 19 and 20 are in effect, grounded. Thus, the resonant circuit between the collectors of transistors 11 and 12 is equivalent to the circuit as shown in FIG. 2, in which $C_S$ represent the capacitance of capacitors 19 and 20, and R represents the total resistance of the collector load resistors of transistors 11 and 12.

Accordingly, the oscillator circuit of FIG. 1 will oscillate under the oscillation frequency condition expressed by the following equation (1) and hence at the collectors of transistors 11 and 12 (i.e. at the output terminals 17 and 18) there are obtained oscillation signal voltages $v_1$ and $v_2$ which are opposite in phase as shown in FIG. 1.

$$\omega^2 = \frac{1}{L_O(C_O + \frac{C_S}{2})} \quad (1)$$

In this case, currents $i_3$ and $i_4$, which will flow through capacitors 19 and 20, are expressed in terms of the voltages $v_1$ and $v_2$ that appeared at the collectors of transistors 11 and 12 as follows:

$$i_3 = j\omega_O C_S v_1 \quad \ldots (2)$$

$$i_4 = j\omega_O C_S v_2 \quad \ldots (3)$$

That is, the currents, which lead by 90° the phase of oscillation signal voltages $v_1$ and $v_2$, respectively, flow through capacitors 19 and 20. As a result, at the other output terminals 25 and 26 there are obtained oscillation signal voltages $v_3$ and $v_4$ which lead by 90° the phase of the oscillation signal voltages $v_1$ and $v_2$ that appear at the output terminals 17 and 18, respectively, as shown in FIG. 1. In other words, transistors 21 and 22 function to convert the current $i_3$ and $i_4$ to the voltage $v_3$ and $v_4$, respectively.

As described above, according to the example of the invention, the oscillation signals different in phase by 90° from each other can be directly obtained from the oscillator circuit itself, which will mean that an additional phase shifter for effecting a phase shift of 90° can be omitted.

In addition, the above example of the invention utilizes a resonant circuit, so that the oscillation remains stable even at high frequency.

Further, since the example of the invention shown in FIG. 1 is of the differential type in oscillation mode, the oscillation signal component flows only through the loop of the oscillator circuit, and does not flow along conductors connected either to the power source or to ground. Therefore, the oscillator circuit of the invention shown in FIG. 1 can be constructed as an integrated circuit together with other high gain amplifiers and the like, without the disadvantage of adverse effects, such as crosstalk from the oscillator. Therefore, this example of the invention is especially suitable to be made as an integrated circuit.

In the example of FIG. 1, the collectors of transistors 11 and 12 are connected to the bases of one another through the base-emitter paths of separate transistors 14 and 15, each being of the emitter follower configuration, but it may be possible that the collectors of transistors 11 and 12 are connected directly to the bases of one another.

Figure 3:
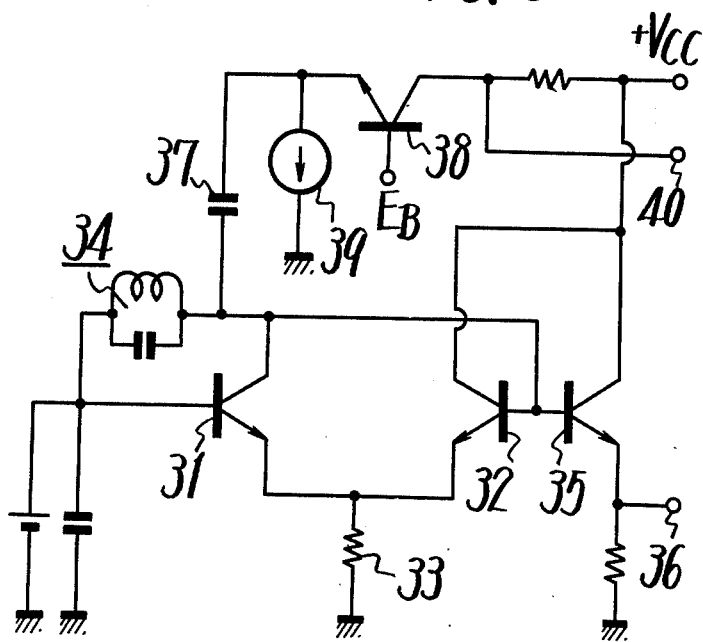
FIG. 3 is a circuit diagram showing another example of the invention.

FIG. 3 is a circuit diagram showing another example of the oscillator circuit according to this invention which produces oscillation outputs different in phase by 90° from each other in a single circuit. In the example of FIG. 3, there are provided transistors 31 and 32 whose emitters are grounded together through a resistor 33 to form a differential amplifier. A parallel resonant circuit 34 consisting of a coil and a capacitor is inserted between the collector and base of transistor 31. The oscillation signal obtained at the collector of transistor 31 is delivered through an emitter-follower transistor 35 to one output terminal 36. The collector of transistor 31, i.e. one terminal of parallel resonant circuit 34, is connected through a capacitor 37 to the emitter of transistor 38 whose base is supplied with a constant voltage $E_B$ and whose emitter is grounded through a constant current source 39. Another output terminal 40 is provided from the collector of transistor 38 and another oscillation signal, whose phase differs by 90° from that of the oscillation signal that appears at the former output terminal 36, is provided at the output terminal 40. Therefore, the need for a phase shifter to provide a phase shift of 90° is avoided in the example of the invention shown in FIG. 3.

It will be apparent that many modifications and variations can be effected by one skilled in the art without departing from the spirit or scope of the novel concepts of the present invention, which is to be measured by the appended claims.

We claim as our invention:

1. An oscillating circuit comprising oscillator means having a first output terminal for providing a first reference signal;
   converting means for converting a voltage to a current and having an input terminal with low input impedance and a second output terminal for providing a second reference signal; and
   reactive means connecting said first output terminal and said input terminal of said converting means, so that said first and second reference signals are provided with a phase difference of 90° with respect to each other.

2. An oscillating circuit according to claim 1, wherein said converting means includes a common-base transistor having an emitter, a base, and a collector, said emitter, said base, and said collector being connected to said input terminal, a bias source, and said second output terminal, respectively.

3. An oscillating circuit according to claim 2, further comprising a voltage source, a current sink connected to said emitter of said transistor, and a load resistor connected between said collector of said transistor and said voltage source.

4. An oscillating circuit according to claim 1, wherein said oscillator means includes an amplifier having a second input terminal and a third output terminal, said third output terminal being connected with said first output terminal, and a resonance circuit connected between said second input terminal and said first output terminal.

5. An oscillating circuit according to claim 1, wherein said reactive means includes a capacitor connected between said first output terminal and said input terminal.

6. An oscillating circuit according to claim 1, wherein said oscillator means comprises a differential amplifier which includes a pair of amplifying devices each having a current carrying electrode, an output electrode and an input electrode, a constant current source with the current-carrying electrodes of said amplifying device being connected together thereto, a resonant circuit connected between the output electrodes of said amplifying devices, and a pair of isolation devices for connecting the output electrode of each of said amplifying devices with the input electrode of the other of said amplifying devices.

7. An oscillating circuit according to claim 6, wherein said converting means includes first and second common-base transistors each having an emitter, a base connected to a bias source and a collector, said emitter of said first common-base transistor being connected through said reactive means to the output electrode of one of said amplifying devices, the emitter of said second common-base transistor being connected through said reactive means to the output electrode of the other of said amplifying devices, and the collector of said common-base transistor being connected to a voltage source through respective load resistors to provide said second output and an output complementary to said second output, respectively.

8. An oscillating circuit according to claim 7, wherein said reactive means includes first and second capacitors connected between the emitter of said first common-base transistor and the output electrode of one of said amplifying devices, and between the emitter of said second common-base transistor and the output electrode of the other of said amplifying devices, respectively.

9. An oscillating circuit according to claim 8, further including a current sink connected with the emitter of each of said common-base transistors.

10. An oscillating circuit according to claim 3, wherein said oscillator means includes a pair of transistors each having an emitter, a base, and a collector, and arranged with the emitters thereof connected together to a common load, while the collector of one of said transistors is connected to a voltage source, a resonance circuit is connected between the base and the collector of the other of said transistors, whereby the collector of said other transistor forms said first output terminal, and the base of said one transistor is connected to said first output terminal.

* * * * *